United States Patent [19]
Taylor

[11] Patent Number: 6,122,532
[45] Date of Patent: Sep. 19, 2000

[54] RF AMPLIFIER WITH REDUCED POWER CONSUMPTION

[75] Inventor: Stewart S. Taylor, Beaverton, Oreg.

[73] Assignee: TriQuint Semiconductor Corporation, Hillsboro, Oreg.

[21] Appl. No.: 09/196,625

[22] Filed: Nov. 18, 1998

[51] Int. Cl.$^7$ ................................ H04B 1/38; H03F 3/04
[52] U.S. Cl. ............................................. 455/574; 330/296
[58] Field of Search ................................... 455/422, 574, 455/575; 330/296, 302, 311

[56] References Cited

U.S. PATENT DOCUMENTS

| | | | |
|---|---|---|---|
| 5,392,004 | 2/1995 | Masliah | 330/296 |
| 5,493,255 | 2/1996 | Murtojarvi | 330/296 |
| 5,548,248 | 8/1996 | Wang | 330/288 |
| 5,764,107 | 6/1998 | Stone | 330/279 |
| 5,889,433 | 3/1999 | Honma | 330/273 |
| 5,923,215 | 7/1999 | Hans | 330/149 |
| 5,929,710 | 7/1999 | Bien | 330/301 |

OTHER PUBLICATIONS

AACD '98, Workshop on Advances In Analog Circuit Design, Hotel Richmond, Copenhagen, Denmark, *"Design of Broadband Low–Noise Amplifiers in Deep–Submicron CMOS Technologies,"* Johan Janssens and Michiel Steyaert, Apr. 28–30, 1998.

*Primary Examiner*—Reinhard J. Eisenzopf
*Assistant Examiner*—Charles N. Appiah
*Attorney, Agent, or Firm*—Skjerven, Morrill, MacPherson LLP

[57] ABSTRACT

Accordingly, an RF amplifier with reduced power consumption is disclosed. In one embodiment, the RF amplifier includes first and second transistors for amplifying signals. The first transistor has a gate coupled to an input signal source. The second transistor has a gate coupled to the gate of the first transistor for signals in the operating frequency range of the amplifier. The second transistor also has a drain terminal coupled to the drain of the first transistor for signals in the operating frequency range. A first bias voltage generator circuit coupled to the gate of the first transistor provides a first bias voltage to the gate of the first transistor. Likewise, a second bias voltage generator circuit coupled to the gate of the second transistor provides a second bias voltage to the gate of the second transistor. An impedance connected between the source of the second transistor and the drain of the first transistor conducts a bias current. The first and second transistors each conduct a varying current in response to an input signal from the input signal source. In one embodiment, a load impedance coupled to the drain of the second transistor conducts a variable current generated by the first and second transistors and converts the variable current into an output voltage. The amplifier consumes only half the power of a single-transistor amplifier with the same effective device width and distortion level.

24 Claims, 2 Drawing Sheets

RF AMPLIFIER WITH REDUCED POWER CONSUMPTION

TECHNICAL FIELD OF THE INVENTION

The present invention relates to RF signal processing, and in particular to an RF amplifier with reduced power consumption.

BACKGROUND OF THE INVENTION

In cellular telephones and other communication devices, low noise radio frequency (RF) amplifiers are typically used to amplify RF signals after reception. In such devices, linear amplification is desired to prevent signal distortion. Current drain is also a consideration, especially for mobile devices such as cellular telephones, due to the limited quantity of energy stored in the accompanying battery.

Linearity and current drain are often competing considerations. At a low bias current, an amplifier may introduce unacceptable levels of signal distortion. However, to achieve optimum linearity may require a high bias current level, thereby decreasing battery life.

SUMMARY OF THE INVENTION

Therefore, a need has arisen for an RF amplifier that addresses the disadvantages and deficiencies of the prior art. In particular, a need has arisen for an RF amplifier with high linearity at a low bias current.

Accordingly, an RF amplifier with reduced power consumption is disclosed. In one embodiment, the RF amplifier includes first and second transistors for amplifying signals. The first transistor has a gate coupled to an input signal source. The second transistor has a gate coupled to the gate of the first transistor for signals in the operating frequency range of the amplifier. The second transistor also has a drain terminal coupled to the drain of the first transistor for signals in the operating frequency range. A first bias voltage generator circuit coupled to the gate of the first transistor provides a first bias voltage to the gate of the first transistor. Likewise, a second bias voltage generator circuit coupled to the gate of the second transistor provides a second bias voltage to the gate of the second transistor. An impedance connected between the source of the second transistor and the drain of the first transistor conducts a bias current. The first and second transistors each conduct a varying current in response to an input signal from the input signal source. In one embodiment, a load impedance coupled to the drain of the second transistor conducts a variable current generated by the first and second transistors and converts the variable current into an output voltage.

A technical advantage of the present invention is that the amplifier consumes only half the bias current of a single-transistor amplifier with the same effective device width and distortion levels. Another technical advantage of the present invention is that, for a given bias current, the amplifier provides improved linearity over a single-transistor amplifier.

BRIEF DESCRIPTION OF THE DRAWINGS

For a more complete understanding of the present invention and for further features and advantages, reference is now made to the following description taken in conjunction with the accompanying drawings, in which.

DETAILED DESCRIPTION OF THE PREFERRED EMBODIMENT

Figure 1:
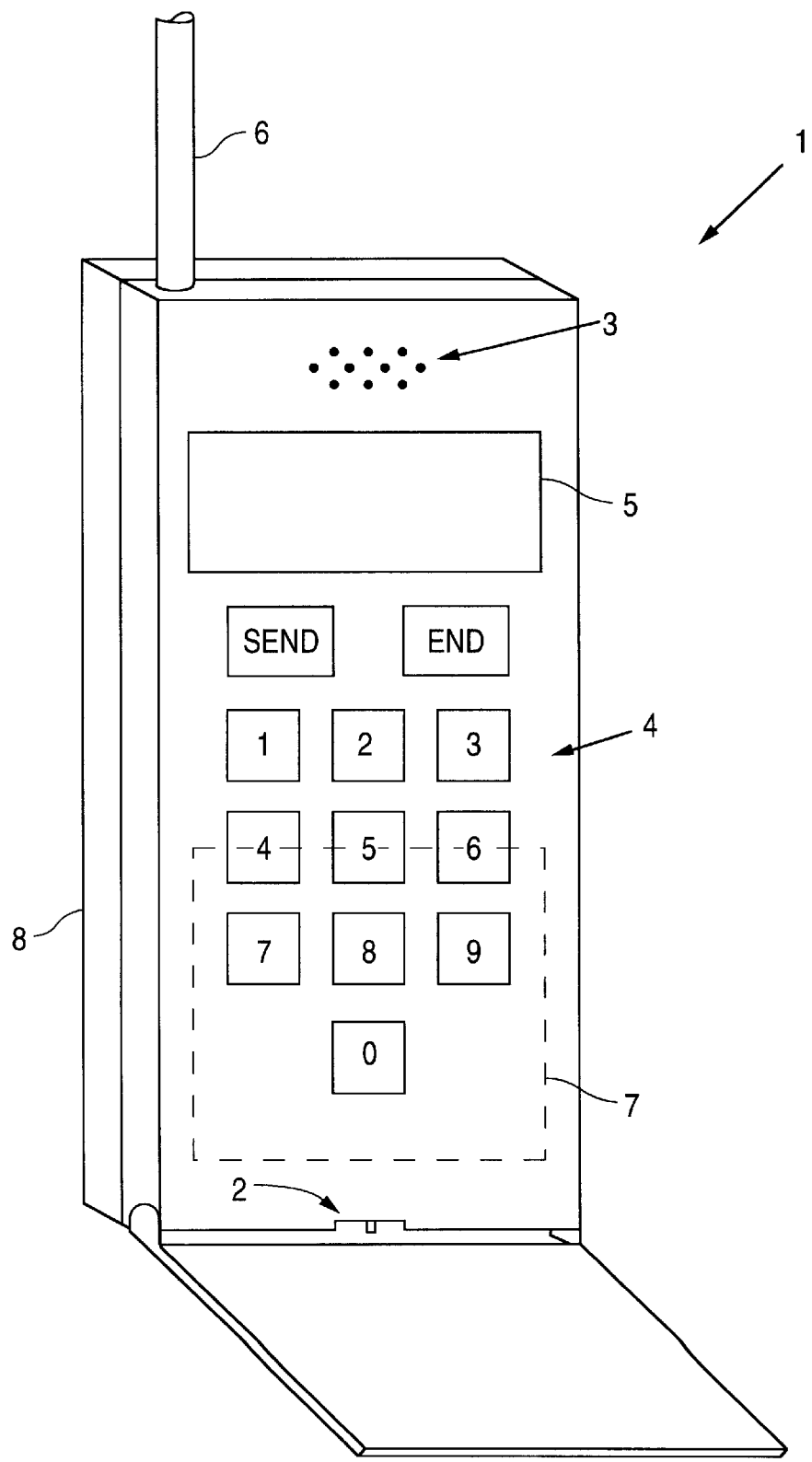
FIG. 1 is a simplified perspective view of a cellular telephone in which the invention may be implemented.
Figure 2:
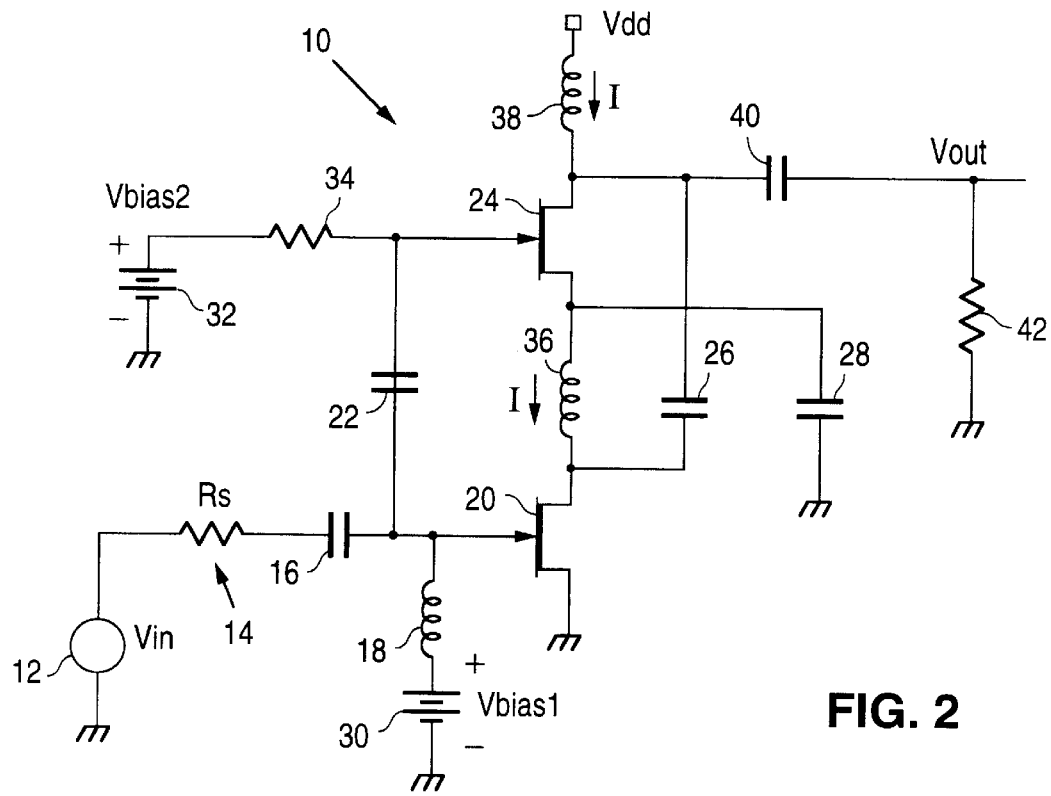
FIG. 2 is a schematic diagram of an RF amplifier constructed in accordance with one embodiment of the present invention.
Figure 3:
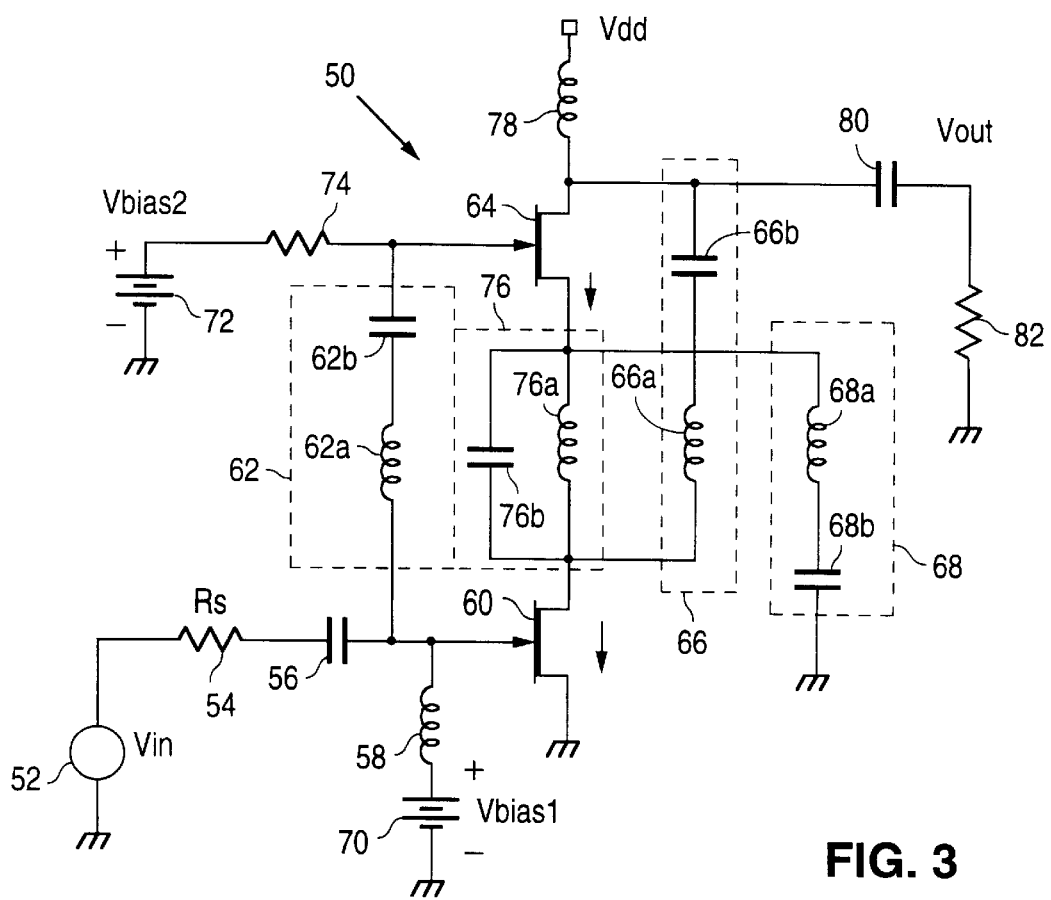
FIG. 3 is a schematic diagram of an alternative RF amplifier constructed in accordance with one embodiment of the present invention.

The preferred embodiments of the present invention and their advantages are best understood by referring to FIGS. 1, 2 and 3 of the drawings. Like numerals are used for like and corresponding parts of the various drawings.

Referring to FIG. 1, a mobile telephone 1 constructed in accordance with the present invention is shown. Mobile telephone 1 has a microphone 2, a speaker 3, a keypad 4, a display screen 5, and a radio frequency (RF) antenna 6 for sending and receiving signals from a station such as a cell tower (not shown). Mobile telephone 1 also has internal circuitry 7 powered by a battery 8. Mobile telephone 1 may be compliant with a signal frequency and modulation standard such as AMPS, PCS, GSM, CDMA, TDMA, DCS 1800 or some other telecommunications standard.

Internal circuitry 7 is coupled to speaker 3 and microphone 2 for communicating with a user. Internal circuitry 7 is also coupled to keypad 4 to receive information regarding keypad entries made by the user. Internal circuitry 7 is also coupled to RF antenna 6 to send and receive identification signals, voice signals, keypad entries and other information to and from the station.

Internal circuitry 7 communicates with the station via RF signals transmitted through the atmosphere. To receive RF signals, internal circuitry 7 includes a low noise amplifier (not shown in FIG. 1) capable of amplifying RF signals.

Referring to FIG. 2, an RF amplifier 10 for use in internal circuitry 7 of cellular telephone 1 or in other RF devices is shown. RF amplifier 10 has high linearity and reduced power consumption, as will be described more fully below. The operation of RF amplifier 10 will now be described.

An input signal $V_{in}$ is provided to RF amplifier 10 by an input signal source 12 with a source impedance $R_S$ represented by resistor 14. Input signal source 12 is coupled to a DC blocking capacitor 16. Capacitor 16 may also form an input impedance matching network with an inductor 18. Thus, capacitor 16 and inductor 18 together may provide an input impedance for RF amplifier 10 which preferably matches the source impedance $R_S$ of input signal source 12 to the input impedance of amplifier transistors 20 and 24 which will be described more fully below. Alternatively, the input matching network may provide optimum noise performance or some compromise among gain return loss, noise figure and distortion.

DC blocking capacitor 16 is connected between input signal source 12 and the gate of a field effect transistor 20. Another DC blocking capacitor 22 is connected between the gate of transistor 20 and the gate of a second field effect transistor 24. Capacitor 22 has sufficiently high capacitance to act as a short circuit with respect to AC signals at the operating frequency of RF amplifier 10.

Likewise, the drains of transistors 20 and 24 are connected by a DC blocking capacitor 26, which acts as an open circuit for DC and a short circuit for AC signals at the operating frequency of RF amplifier 10. Similarly, the sources of transistors 20 and 24 are both connected to ground. In the case of transistor 24, the source is connected to ground via a DC blocking capacitor 28, which acts as an open circuit for DC and a short circuit for AC signals at the operating frequency of RF amplifier 10. The sources of transistors 20 and 24 may therefore be considered to be capacitively coupled.

The gate of transistor 20 is biased by a reference voltage source 30, which is connected between inductor 18 and ground. Reference voltage source 30 generates a bias voltage $V_{bias1}$. The gate of transistor 20 therefore receives a voltage equal to $c_1 V_{in} + V_{bias1}$, where $c_1$ is a design-dependent constant preferably between 0.5 and 2. Similarly, the gate of transistor 24 is biased by a reference voltage source 32, which is connected between a resistor 34 and ground. Resistor 34 has a large resistance to isolate reference voltage source 32 from the input signal $V_{in}$ and to prevent degradation of the noise figure of the circuit. Reference voltage source 32 generates a bias voltage $V_{bias2}$. The gate of transistor 24 therefore receives a voltage equal to $c_2 V_{in} + V_{bias2}$, where $c_2$ is a design-dependent constant that is preferably approximately equal to $c_1$.

As described above, the gates of transistors 20 and 24 are biased with voltages of $V_{bia1}$ and $V_{bias2}$, respectively. These bias voltages are preferably greater than or approximately equal to the respective threshold voltages of transistors 20 and 24. Each transistor therefore conducts a bias current when no input signal is received. Preferably, both transistors 20 and 24 are biased in the saturation region for high gain and low noise figure.

An inductor 36 is connected between the source of transistor 24 and the drain of transistor 20. Inductor 36 acts as an RF choke, and conducts only the bias currents for transistors 20 and 24. Since inductor 36 provides the only DC conduction path for transistors 20 and 24, both transistors 20 and 24 conduct the same bias current (I). A small capacitor (not shown) may also be connected in parallel with inductor 36 to raise the impedance between transistors 20 and 24 at the operating frequency of RF amplifier 10.

Another inductor 38 is connected between a voltage source ($V_{dd}$) and the drain of transistor 24. Inductor 38 forms part of the output matching network with capacitor 40, and conducts only the bias current I for transistors 20 and 24.

Transistors 20 and 24 act as transconductance amplifiers with capacitively coupled outputs. Collectively, transistors 20 and 24 generate an alternating current output that is received by a DC blocking capacitor 40. A load resistance 42 is connected between DC blocking capacitor 40 and ground. Load resistance 42 is preferably conjugate-matched to the output of transistors 20 and 24.

Transistors 20 and 24 are in parallel for purposes of amplifying RF signals at the operating frequency of RF amplifier 10. Thus, if each transistor 20 and 24 has a fixed channel length and a width W, then the total effective device width is 2W. In other words, transistors 20 and 24 amplify input signals in a manner similar to a single transistor with a width 2W.

However, transistors 20 and 24 are in series for purposes of biasing. Thus, since each transistor 20 and 24 conducts a current I, the total effective device current is 2I. In other words, transistors 20 and 24 operate in a manner similar to a single transistor with a width 2W and a current 2I.

Thus, transistors 20 and 24 form an amplifier with a distortion level, as indicated by the third-order intercept point $IP_3$, similar to that of a single transistor with a width 2W and a current 2I. However, transistors 20 and 24 attain this linearity while draining only half the current of the aforementioned single transistor configuration, thereby increasing battery life for a battery-powered RF device such as cellular telephone 1.

Furthermore, since $IP_3$ is dependent on transistor current, transistors 20 and 24 have considerably better linearity than could be obtained, for example, with a single transistor with current I. For example, transistors 20 and 24 have an $IP_3$ which is substantially better, by typically 3 dB or more, than a single transistor with a width W and a current I. In addition, since transistors 20 and 24 together have an effective device width 2W, they will in some cases exhibit a better noise figure than a single transistor with width W.

Referring to FIG. 3, an alternative RF amplifier 50 is shown. Like RF amplifier 10, RF amplifier 50 receives an input signal $V_{in}$ from an input signal source 52 with a source impedance $R_S$ represented by resistor 54. Input signal source 52 is coupled to a DC blocking capacitor 56. Capacitor 56 also forms an input impedance matching network with an inductor 58. This impedance matching network preferably matches the source impedance $R_S$ of input signal source 52 to the input of transistors 60 and 64.

DC blocking capacitor 56 is connected between input signal source 52 and the gate of a field effect transistor 60, which will be described more fully below. A resonant circuit 62, comprising an inductor 62a and a capacitor 62b connected in series, is connected between the gate of transistor 60 and the gate of a second field effect transistor 64. Resonant circuit 62 blocks direct current but acts as a short circuit with respect to AC signals at the operating frequency of RF amplifier 50.

Likewise, the drains of transistors 60 and 64 are connected by a resonant circuit 66 comprising an inductor 66a and a capacitor 66b connected in series. Resonant circuit 66 acts as an open circuit for DC and a short circuit for AC signals at the operating frequency of RF amplifier 50. Similarly, the sources of transistors 60 and 64 are both connected to ground. In the case of transistor 64, the source is connected to ground via a resonant circuit 68 comprising an inductor 68a and a capacitor 68b connected in series. Resonant circuit 68 acts as an open circuit for DC and a short circuit for AC signals at the operating frequency of RF amplifier 50.

The gate of transistor 60 is biased by a reference voltage source 70, which is connected between inductor 58 and ground. Reference voltage source 70 generates a bias voltage $V_{bias1}$. The gate of transistor 60 therefore receives a voltage equal to $c_3 V_{in} + V_{bias1}$, where $c_3$ is a design-dependent constant preferably between 0.5 and 2. Similarly, the gate of transistor 64 is biased by a reference voltage source 72, which is connected between a resistor 74 and ground. Resistor 74 has a large resistance to isolate reference voltage source 72 from the input signal $V_{in}$ and to prevent degradation of the noise figure of the circuit. Reference voltage source 72 generates a bias voltage $V_{bias2}$. The gate of transistor 64 therefore receives a voltage equal to $c_4 V_{in} + V_{bias2}$, where $c_4$ is a design-dependent constant that is preferably approximately equal to $c_3$.

The gates of transistors 60 and 64 are biased with voltages of $V_{bias1}$ and $V_{bias2}$, respectively. These bias voltages are preferably greater than or approximately equal to the respective threshold voltages of transistors 60 and 64. Each transistor therefore conducts a bias current when no input signal is received. Both transistors 60 and 64 are preferably biased to conduct approximately equal bias currents (I).

A resonant circuit 76, comprising an inductor 76a and a capacitor 76b connected in parallel, is connected between the source of transistor 64 and the drain of transistor 60. Resonant circuit 76 has a high impedance at the operating frequency of RF amplifier 50. Resonant circuit 76 therefore conducts only the bias current I for transistors 60 and 64.

An inductor 78 is connected between a voltage source ($V_{dd}$) and the drain of transistor 64. Inductor 78 forms part of the output matching network with capacitor 80, and conducts only the bias current I for transistors 60 and 64.

Transistors 60 and 64 act as transconductance amplifiers with coupled outputs. Collectively, transistors 60 and 64 generate an alternating current output that is received by a DC blocking capacitor 80. A load resistance 82 is connected between DC blocking capacitor 80 and ground. Load resistance 82 is preferably conjugate-matched to the output of transistors 60 and 64.

RF amplifier 50 operates in a manner similar to RF amplifier 10. Thus, transistors 60 and 64 exhibit performance similar to that of a single transistor with a width 2W and a current 2I while only drawing a current I. RF amplifier 50 may therefore be used to increase battery life for a battery-powered RF device such as cellular telephone 1.

In RF amplifier 50, the DC blocking capacitors 22, 26 and 28 of RF amplifier 10 have been replaced with resonant circuits 62, 66 and 68, respectively. Likewise, inductor 36 in RF amplifier 10 is replaced by resonant circuit 76 in RF amplifier 50. These resonant circuits can be tuned to achieve the desired impedance characteristics at the operating frequency of RF amplifier 50. However, resonant circuits 62, 66, 68 and 76 generally require smaller passive elements than the corresponding elements of RF amplifier 10.

Although the present invention and its advantages have been described in it should be understood that various changes, substitutions, and alterations made therein without departing from the spirit and scope of the invention as by the appended claims.

What is claimed is:

1. An amplifier for amplifying AC signals in an operating frequency range, comprising:
   a first transistor having first, second and third terminals, the first terminal being coupled to an input signal source;
   a second transistor having first, second and third terminals, the first terminal being coupled to the first terminal of the first transistor for signals in the operating frequency range, the second terminal of the second transistor being coupled to the second terminal of the first transistor for signals in the operating frequency range;
   a first bias voltage generator circuit coupled to the first terminal of the first transistor, the first bias voltage generator circuit being operable to provide a first bias voltage to the first terminal of the first transistor;
   a second bias voltage generator circuit coupled to the first terminal of the second transistor, the second bias voltage generator circuit being operable to provide a second bias voltage to the first terminal of the second transistor; and
   an impedance connected between the third terminal of the second transistor and the second terminal of the first transistor, the impedance being operable to conduct a bias current;
   wherein the first and second transistors are each operable to conduct a varying current in response to an input signal from the input signal source.

2. The amplifier of claim 1, further comprising a load impedance coupled to the second terminal of the second transistor, the load impedance being operable to conduct a variable current generated by the first and second transistors, and operable to convert the variable current into an output voltage.

3. The amplifier of claim 1, further comprising a resonant circuit connected between the first terminal of the first transistor and the first terminal of the second transistor, the resonant circuit being tuned to present a low impedance to signals in the operating frequency range and a high impedance to direct current.

4. The amplifier of claim 3, further comprising a second resonant circuit connected between the second terminal of the first transistor and the second terminal of the second transistor, the second resonant circuit being tuned to present a low impedance to signals in the operating frequency range and a high impedance to direct current.

5. The amplifier of claim 1, further comprising a resonant circuit connected between the second terminal of the first transistor and the second terminal of the second transistor, the resonant circuit being tuned to present a low impedance to signals in the operating frequency range and a high impedance to direct current.

6. The amplifier of claim 1, further comprising a capacitor connected between the first terminal of the first transistor and the first terminal of the second transistor.

7. The amplifier of claim 6, further comprising a second capacitor connected between the second terminal of the first transistor and the second terminal of the second transistor.

8. The amplifier of claim 1, further comprising a capacitor connected between the second terminal of the first transistor and the second terminal of the second transistor.

9. The amplifier of claim 1, wherein the impedance comprises an inductor.

10. The amplifier of claim 1, wherein the impedance comprises a resonant circuit tuned to present a high impedance to signals in the operating frequency range.

11. The amplifier of claim 1, further comprising:
    a voltage source; and
    a second impedance connected between the third terminal of the second transistor and the voltage source, the second impedance being operable to conduct the bias current.

12. The amplifier of claim 11, wherein the second impedance comprises an inductor.

13. A cellular telephone comprising:
    a microphone;
    a speaker;
    an antenna operable to transmit and receive broadcast electromagnetic signals;
    internal circuitry coupled to the microphone and operable to receive voice signals from the microphone, the internal circuitry being coupled to the speaker and operable to transmit voice signals to the speaker, the internal circuitry being coupled to the antenna and operable to transmit and receive RF signals to and from the antenna, the internal circuitry including an RF amplifier operable to amplify at least one of the RF signals, the RF amplifier having:
    a first transistor having a gate terminal coupled to an input signal source;
    a second transistor having a gate terminal coupled to the gate terminal of the first transistor for signals in the operating frequency range, the second transistor further having a drain terminal coupled to a drain terminal of the first transistor for signals in the operating frequency range;
    a first bias voltage generator circuit coupled to the gate terminal of the first transistor, the first bias voltage generator circuit being operable to provide a first bias voltage to the gate terminal of the first transistor;
    a second bias voltage generator circuit coupled to the gate terminal of the second transistor, the second bias voltage generator circuit being operable to provide a second bias voltage to the gate terminal of the second transistor;

an impedance connected between a source terminal of the second transistor and the drain terminal of the first transistor, the impedance being operable to conduct a bias current;

wherein the first and second transistors are each operable to conduct a varying current in response to an input signal from the input signal source.

14. The cellular telephone of claim 13, wherein the amplifier further comprises a load impedance coupled to the drain terminal of the second transistor, the load impedance being operable to conduct a variable current generated by the first and second transistors, and operable to convert the variable current into an output voltage.

15. The cellular telephone of claim 13, wherein the amplifier further comprises a resonant circuit connected between the gate terminal of the first transistor and the gate terminal of the second transistor, the resonant circuit being tuned to present a low impedance to signals in the operating frequency range and a high impedance to direct current.

16. The cellular telephone of claim 13, wherein the amplifier further comprises a resonant circuit connected between the drain terminal of the first transistor and the drain terminal of the second transistor, the resonant circuit being tuned to present a low impedance to signals in the operating frequency range and a high impedance to direct current.

17. The cellular telephone of claim 13, wherein the amplifier further comprises a capacitor connected between the first terminal of the first transistor and the first terminal of the second transistor.

18. The cellular telephone of claim 17, wherein the amplifier further comprises a second capacitor connected between the second terminal of the first transistor and the second terminal of the second transistor.

19. The cellular telephone of claim 13, wherein the amplifier further comprises a capacitor connected between the second terminal of the first transistor and the second terminal of the second transistor.

20. The cellular telephone of claim 13, wherein the impedance comprises an inductor.

21. The cellula r telephone of claim 13, wherein the impedance comprises a resonant circuit tuned to present a high impedance to signals in the operating frequency range.

22. The cellular telephone of claim 13, wherein the amplifier further comprises:

a voltage source; and a second impedance connected between the third terminal of the second transistor and the voltage source, the second impedance being operable to conduct the bias current.

23. A method for amplifying an input signal, comprising:

receiving at a gate terminal of a first transistor a first bias voltage and the input signal;

conducting a first current by the first transistor in response to a sum of the first bias voltage and the input signal;

receiving at a gate terminal of a second transistor a second bias voltage and the input signal;

conducting a second current by the second transistor in response to a sum of the second bias voltage and the input signal;

supplying a bias current from a power supply to the second transistor;

supplying the bias current from the second transistor to the first transistor; and receiving at an output node an output current derived from a sum of the first and second currents.

24. The method of claim 23, further comprising conducting the output current by a load impedance to generate an output voltage at the output node.

* * * * *

UNITED STATES PATENT AND TRADEMARK OFFICE
CERTIFICATE OF CORRECTION

PATENT NO. : 6,122,532
DATED : September 19, 2000
INVENTOR(S) : Stewart S. Taylor It is certified that error appears in the above-identified patent and that said Letters Patent is hereby corrected as shown below:

Column 5,
Line 26, after "described" insert -- detail --;
Line 27, after "alterations" insert -- can be --;
Line 28, after "as" insert -- defined --; and Column 8,
Line 5, delete "cellula r" and insert -- cellular --.

Signed and Sealed this

Eighth Day of October, 2002

Attest:

JAMES E. ROGAN
Attesting Officer  Director of the United States Patent and Trademark Office